United States Patent
Hendricks et al.

(10) Patent No.: US 6,410,149 B1
(45) Date of Patent: *Jun. 25, 2002

(54) SILANE-BASED NANOPOROUS SILICA THIN FILMS AND PRECURSORS FOR MAKING SAME

(75) Inventors: Neil Hendricks, Sonora, CA (US); Douglas M. Smith, Albuquerque, NM (US); Teresa Ramos, Albuquerque, NM (US); Stephen Wallace, Albuquerque, NM (US); James Drage, Fremont, CA (US)

(73) Assignee: AlliedSignal Inc., Morristown, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/378,705

(22) Filed: Aug. 23, 1999

Related U.S. Application Data (60) Provisional application No. 60/098,068, filed on Aug. 27, 1998.

(51) Int. Cl.$^7$ .............................. B23B 9/04; H01L 21/31; B05D 3/02; B05D 1/02; B05D 1/18
(52) U.S. Cl. .................... 428/447; 428/448; 438/761; 438/763; 438/782; 438/787; 427/96; 427/387; 427/421; 427/430.1
(58) Field of Search ................................ 438/782, 761, 438/763, 790, 787; 428/447, 428; 427/96, 387, 421, 430.1

(56) References Cited

U.S. PATENT DOCUMENTS 5,847,433 A * 12/1998 Cho et al. .................. 257/632
6,022,812 A * 2/2000 Smith et al. ................ 438/761
6,143,643 A * 11/2000 Carter et al. ............... 438/622

FOREIGN PATENT DOCUMENTS

| EP | 0 477 155 A | 9/1991 |
| EP | 0 775 669 | 5/1997 |

OTHER PUBLICATIONS

Moon–Ho, et al., Aug. 1, 1997, "SiO/sub 2/aerogel film as a novel intermetal dielectric" *J. of Applied Physics* 82(3):1299–1304.

Moon–Ho, et al., Mar. 16, 1998, "Leakage current and dielectric breakdown behavior in SiO/sub 2/aerogel films" *Applied Physics Letters* 72(11):1391–1393.

Chow L A et al., Apr. 1–4, 1997 "The processing and characterization of hybrid silica–based xerogel films" *Mat. Res. Proc.* 476: 105–110.

* cited by examiner

*Primary Examiner*—Robert Dawson
*Assistant Examiner*—Michael J Feely
(74) *Attorney, Agent, or Firm*—Roberts & Mercanti, LLP

(57) ABSTRACT

Improved processes for forming hydrophobic nanoporous dielectric coatings on substrates are provided. The improved processes involve forming a reaction mixture that combines at least one mono-, di- or trifunctional precursor with at least one tetrafunctional precursor, recovering the reaction product, and then depositing the reaction product onto a suitable substrate, followed by gelling of the deposited film. Precursors include alkoxy, acetoxy and halogen leaving groups. Optional processes to enhance the hydrophobicity of a nanoporous silica film are also provided, as well as improved nanoporous silica films, coated substrates and integrated circuits prepared by the new processes

24 Claims, 1 Drawing Sheet

SILANE-BASED NANOPOROUS SILICA THIN FILMS AND PRECURSORS FOR MAKING SAME

CROSS REFERENCE TO RELATED APPLICATION

This application claims the benefit of provisional application serial number 60/098,068, filed on Aug. 27, 1998, the contents of which is incorporated herein by reference in its entirety.

FIELD OF THE INVENTION

The present invention relates to low dielectric constant nanoporous silica and to improved processes for producing the same on substrates suitable for use in the production of integrated circuits.

BACKGROUND OF THE INVENTION

As feature sizes in integrated circuits approach 0.25 μm and below, problems with interconnect RC delay, power consumption and signal cross-talk have become increasingly difficult to resolve. It is believed that the integration of low dielectric constant materials for interlevel dielectric (ILD) and intermetal dielectric (IMD) applications will help to solve these problems.

Nanoporous Films

One material with a low dielectric constant is nanoporous silica, which, as a consequence of the introduction of air, that has a dielectric constant of 1, into the material via its nanometer-scale pore structure, can be prepared with relatively low dielectric constants ("k"). Nanoporous silica is attractive because it employs similar precursors, including organicsubstituted silanes, e.g., tetramethoxysilane ("TMOS") and/or tetraethoxysilane ("TEOS"), as are used for the currently employed spin-on-glasses ("SOG") and chemical vapor disposition ("CVD") silica $SiO_2$. Nanoporous silica is also attractive because it is possible to control the pore size, and hence the density, material strength and dielectric constant of the resulting film material. In addition to a low k, nanoporous silica offers other advantages including: 1) thermal stability to 900° C., 2) substantially small pore size, i e at least an order of magnitude smaller in scale than the microelectronic features of the integrated circuit), 3) as noted above, preparation from materials such as silica and TEOS that are widely used in semiconductors, 4) the ability to "tune" the dielectric constant of nanoporous silica over a wide range, and 5) deposition of a nanoporous film can be achieved using tools similar to those employed for conventional SOG processing.

Nanoporous silica films have previously been fabricated by a number of methods. For example, nanoporous silica films have been prepared using a mixture of a solvent and a silica precursor, which is deposited on a substrate, eg., a silicon wafer suitable for producing an integrated circuit, by conventional methods, e.g., including spin-coating and dip-coating. The substrate optionally has raised lines on its surface and preferably has electronic elements and/or electrical conduction pathways incorporated on or within its surface. The as-spun film is typically catalyzed with an acid or base catalyst and additional water to cause polymerization/gelation ("aging") and to yield sufficient strength so that the film does not shrink significantly during drying.

The internal pore surfaces of previously prepared nanoporous films are formed of silicon atoms which are terminated in a combination of any or all of the following species; silanol (SiOH), siloxane (SiOSi), alkoxy (SiOR), where R is an organic species such as, but not limited to, a methyl, ethyl, isopropyl, or phenyl groups, or an alkylsilane (SiR), where R is as defined previously. When the internal surface of the nanoporous silica is covered with a large percentage of silanols, the internal surface is hydrophilic and may adsorb significant quantities of atmospheric water. Even if the film is outgassed by heating before subsequent processing, the presence of the polar silanols can contribute negatively to the dielectric constant and dielectric loss. Previously employed methods for overcoming this limitation and rendering the internal pore surfaces of nanoporous silica less hydrophilic include reacting the internal surface silanols with surface modifying agents, including, for example, chlorosilanes or disilazanes. These reactions, which may be conducted in either liquid or gas phases, result in a $(SiO)_{4-x}SiR_x$ [wherein x is an integer ranging from 1 to 3] surface which is normally hydrophobic and less polar than the silanol group it replaced.

However, all of the previously employed methods for producing nanoporous silica films used organic functional moieties to provide hydrophobicity. Although these carbon-containing nanoporous silica films (described, for example, in co-owned patent application Ser. No. 09/111,084, filed Jul. 7, 1998) the disclosure of which is incorporated by reference herein in its entirety) exhibit a number of advantages for semiconductor applications, they also have several potential disadvantages including:

1. Oxidation of the carbon content: During semiconductor processing, e.g., during plasma enhanced chemical vapor deposition (PECVD) and etching, following nanoporous silica film deposition, the presence of organic species can lead to problems such as high via resistance (i.e., the prospective integrated circuit is ruined by "poisoning" the interlayer connectors, due to oxidation of the carbon content of organic substituents, resulting in the deposition of undesirable residues from the etching process in the vias). (see, eg., R. J. Hopkins, T. A. Baldwin, S. K. Gupta, May 7–12, 1989, *ULSI Symposium, ECS*, Allied Signal) which may require additional process steps to rectify.

2. Added mass: For example, the addition of a trimethyl silyl entity $(CH_3)_3Si$ as a replacement for a hydrophilic surface silanol adds significant mass to the nanoporous silica. All else being constant, the added mass can produce a significantly higher refractive index and dielectric constant which may be undesirable.

3. Strength: Normally, for semiconductor applications, one desires a material with both low dielectric constant and high strength. For nanoporous silica, these two properties must be balanced. For a given dielectric constant (refractive index/density), the density is fixed, at least for a specific chemical composition. With fixed density, the strength of the nanoporous silica is maximized by having the greatest fraction of solid within the skeleton of the film rather than as appended surface groups.

Thus, in view of the need for rapid competitive advances in the art of microprocessor fabrication, there remains a constant need in the art to improve upon previous methods and materials. In particular, there is a need to provide nanoporous silica films with hydrophobic pore surfaces, while minimizing the above described undesirable effects of organic surface moieties. In particular, it is strongly desired to provide such nanoporous silica films with reduced mass at the nano-scale pore surfaces. This later property will provide greater material film strength for a given desired dielectric constant. Thus, for all of these reasons, there remains a need in the art for methods and compositions for producing nanoporous films suitable for the production of integrated circuits that have all of the above-described desirable properties, while minimizing those previously indicated shortcomings of the art.

SUMMARY OF THE INVENTION

In order to solve the above mentioned problems and to provide other improvements, the invention provides new methods for effectively producing low dielectric constant nanoporous silica films having a desired range of dielectric constant significantly lower, or having greater strength at the same dielectric constant, than has previously been obtained, while simultaneously avoiding the shortcomings of previously known methods.

Surprisingly, the methods of the present invention are able to achieve this goal by producing nanoporous silica with pore surfaces on which most of the polar silanol (SiOH) functional groups have been replaced by hydrogen functional groups (SiH) and/or a combination of hydrogen functional groups and organic functional groups. The resulting novel pore surfaces also render the produced film somewhat hydrophobic. This is accomplished by employing suitable starting reagents and processes. In particular, the processes of the invention employ SiH and/or SiC (organic) species as surface modification agents, instead of exclusively relying upon surface modification agents based on silicon-hydrocarbon compounds, which have previously been employed. The lower the proportion of organic moieties on the silylated film surface, the lower the mass associated with the pore surfaces, and therefore a correspondingly reduced film density is achieved. This results in an advantageously reduced dielectric constant, while retaining film mechanical strength.

Accordingly, the invention provides novel processes for forming nanoporous dielectric films or coatings on a desired substrate. The novel process includes the steps of (a) forming a reaction mixture by combining at least one multi-functional alkoxysilane with at least one tetrafunctional alkoxysilane, (b) recovering the nanoporous film precursor of (a) from said reaction mixture and depositing the same onto a suitable substrate, and (c) gelling said deposited film to form a nanoporous dielectric coating on said substrate; wherein the multi-functional alkoxysilane is selected from the group consisting of mono-, di- and tri-functional alkoxysilanes.

The multi-functional alkoxysilane is selected from the group having the formula $$A_n\text{-SiH}_m \qquad \text{(Formula 1)}$$

wherein each A is independently an alkoxy (O—R) wherein R is an organic moiety independently selected from the group consisting of an alkyl and an aryl, and wherein n is an integer ranging from 1 to 3; m is an integer ranging from 1 to 3 and the sum of m and n is 4.

A tetrafunctional alkoxylsilane employed in the processes of the invention preferably has a formula of $$A_4\text{-Si} \qquad \text{(Formula 2)}$$

wherein each A is independently an alkoxy (O—R) and R is an organic moiety independently selected from the group consisting of an alkyl and an aryl, In a further aspect of the invention, the alkoxysilane compounds described above may be replaced, in whole or in part, by compounds with acetoxy and/or halogen-based leaving groups. For example, the precursor compound may be an acetoxy ($CH_3$—CO—O—) such as an acetoxy-silane compound and/or a halogenated compound, e.g., a halogenated silane compound and/or combinations thereof. For the halogenated precursors the halogen is, e.g., Cl, Br, I and in certain aspects, will optionally include F.

In yet a further aspect of the invention, the processes of the invention can also include additional optional processing steps to silylate free silanols on nanopore surfaces of the film, with a capping reagent, e.g., trimethylsilyl [TMS, $(CH_3)_3SiO$-] or other suitable, art-known hydrophobic reagents, as described, for example, in co-owned U.S. Ser. No. 09/111,084, filed on Jul. 7, 1998, the disclosure of which is incorporated by reference herein in its entirety. This later process is conducted employing surface modification material that includes an effective amount of a surface modification agent. The nanoporous silica film to be treated is present and the film has a pore structure with hydrophilic pore surfaces. The reaction is conducted by contacting the hydrophilic nanoporous silica film with the surface modification material, which is, as previously mentioned, optionally in a liquid or vapor phase. Further, the reaction is conducted for a period of time sufficient for the surface modification agent to penetrate the pore structure of the film and to produce a treated nanoporous silica film having a dielectric constant of about 3 or less. This process also requires that the surface modification agent is hydrogen-containing and that it is suitable for adding hydrogen moieties to the pore surfaces.

The nanoporous silica dielectric film is optionally produced on a desired substrate by the processes of the invention, or by other art-known processes, prior to treatment by the following process steps. Typically, the film has a nano-scale pore structure with hydrophilic pore surfaces.

In yet another optional aspect, the films produced by the methods of the invention are further coated, e.g., by art-standard spin-on-glass silicon-based polymer precursors, including, but not limited to, LOSP™ and/or HOSP™ siloxanes (low and high organic siloxane polymers, respectively) that are commercially available from Allied-Signal Advanced Microelectronic Materials (Sunnyvale, Calif.). The high or low organic content siloxane film is typically used as an etch-stop or a hardmask, similar to standard $SiO_2$, SiON or SiN in a variety of integration techniques including subtractive aluminum, and damascene and dual damascene processes, where appropriate. It has unexpectedly been found that the addition of such an overcoating of art-standard spin-on-glass silicon-based polymer precursors can enhance the hydrophobicity of the nanoporous silica film surface, e.g., particularly when using high or low organic siloxanes, oxygen resistant siloxanes, and similar silicon based polymer precursors. This overcoating also unexpectedly improves the mechanical strength of the treated nanoporous silica film when nearly any suitable spin-on-glass type of silicon-based polymer precursor is employed.

Thus, in one preferred embodiment, the second dielectric composition comprises a polymer having a structure selected from the group consisting of Formulas 3–10:

$$[\text{H-SiO}_{1.5}]_n[\text{R-SiO}_{1.5}]_m, \qquad \text{(Formula 3)}$$

$$[\text{H}_{0.4-1.0}\text{SiO}_{1.5-1.8}]_n[\text{R}_{0.4-1.0}\text{SiO}_{1.5-1.8}]_m, \qquad \text{(Formula 4)}$$

$$[\text{H}_{0-1.0}\text{SiO}_{1.5-2.0}]_n[\text{R-SiO}_{1.5}]_m, \qquad \text{(Formula 5)}$$

$$[\text{H-SiO}_{1.5}]_x[\text{R-SiO}_{1.5}]_y[\text{SiO}_2]_z, \qquad \text{(Formula 6)}$$

wherein the sum of n and m, or the sum or x, y and z is from about 8 to about 5000, and m and y are selected such that carbon containing substituents are present in an amount of less than about 40 Mole percent; and wherein R, is selected from substituted and unsubstituted straight chain and branched alkyl groups, cycloalkyl groups, substituted and unsubstituted aryl groups, and mixtures thereof;

$$[HSiO_{1.5}]_n[RSiO_{1.5}]_m, \quad \text{(Formula 7)}$$

$$[H_{0.4-1.0}OSiO_{1.5-1.8}]_n[R_{0.4-1.0}SiO_{1.5-1.8}]_m, \quad \text{(Formula 8)}$$

$$[H_{0-1.0}SiO_{1.5-2.0}]_n[RSiO_{1.5}]_m, \quad \text{(Formula 9)}$$

wherein the sum of n and m is from about 8 to about 5000 and m is selected such that the carbon containing substituent is present in an amount of from about 40 Mole percent or greater; and $$[HSiO_{1.5}]_x[RSiO_{1.5}]_y[SiO_2]_z; \quad \text{(Formula 10)}$$

wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof In another optional aspect of the invention, the films produced by the methods of the invention are further coated, e.g., by art-standard spin-on-coating, with copolymer compositions known to the art as oxygen plasma resistant poly(hydrido siloxane compounds having a general formula of.

$$(HSiO_{1.5})_a(HSiO(OR))_b(SiO_2)_c, \quad \text{(Formula 11)}$$

are provided, wherein R is a mixture of H and an alkyl, group having from 1 to 4 carbon atoms; a+b+c=1; 0.5<a<0.99; 0.01<b<0.5; and 0<c<0.5.

DETAILED DESCRIPTION OF THE PREFERRED EMBODIMENT

A number of methods for the preparation of nanoporous silica films on substrates are known to the art, as summarized in the "Description of the Prior Art", above. Such substrates optionally have raised lines on the surface receiving the nanoporous film and preferably are suitable for the production of integrated circuits, e.g., with optional electronic elements and conduction pathways placed under, over and/or adjacent to the nanoporous film. In addition, a number of variations and improvements to these generally known methods for the preparation of nanoporous films are taught by co-owned U.S. patent application Ser. Nos., 09/046,475 and 09/046,473, both filed on Mar. 25, 1998; U.S. patent application Ser. No. 09/054,262, filed on Apr. 3, 1998; and U.S. patent application Ser. Nos. 09/055,244 and 09/055,516, both filed on Apr. 6, 1998, the disclosures of which are incorporated by reference herein in their entireties.

In order to appreciate the nature of the inventive processes, it should be understood that the use of singular terms herein is not intended to be so limited, but, where appropriate, also encompasses the plural, e.g., exemplary processes of the invention may be described as applying to and producing a "film" but it is intended that multiple films can be produced by the described, exemplified and claimed processes, as desired.

Nanoporous silica films formed on a substrate for use according to the invention are generally formed with a porosity of about 50% or greater, and for example, with pore sizes that range from about 1 nm to about 100 nm, more preferably from about 2 nm to about 30 nm, and most preferably from about 3 nm to about 20 nm. The density of the silicon containing composition, including the pores, ranges from about 0.1 to about 1.9 $g/cm^3$, more preferably from about 0.25 to about 1.6 $g/cm^3$, and most preferably from about 0.4 to about 1.2 $g/cm^3$.

In contrast to previous methods, which produced nanoporous silica films having hydrophilic pore surfaces requiring further processing with hydrophobic, carbon containing surface modification agents, the instant invention provides processes for preparing nanoporous films wherein the nanometer scale pores are manufactured with hydrophobic pore surfaces. Further, the instant invention provides processes for further modifying such pore surfaces without relying on carbon-containing surface modification agents while still providing sufficient pore surface hydrophobicity to provide the desired dielectric constant values and/or stability of the dielectric constant in the presence of atmospheric moisture.

Thus, the nanoporous silica films produced by the processes of the invention preferably have a moisture stable dielectric constant that is less than about 3. More preferably, the nanoporous silica films of the invention have a dielectric constant ranging from about 1.1 to about 3.0, even more preferably from about 1.3 to about 3.0, and most preferably from about 1.5 to about 2.5. Further, nanoporous silica films prepared according to the invention are preferably hydrophobic at ambient temperatures; preferably have a thickness ranging from about 0.1 to about 3 microns and are preferably deposited on either plain (blank) or patterned substrates suitable for the production of integrated circuits.

There are three general processing approaches which may be used individually or in combination to obtain a nanoporous film according to the invention. These are:

(1) Preparing the nanoporous film by reacting a multifunctional alkoxysilane, i.e., one or more mono-, di- or trifunctional precursors with one or more tetrafunctional precursors. Preferably, the precursors useful in the processes of the invention have a general formula shown by Formula 1 and/or combinations of particular embodiments of Formula 1:

$$A_n\text{-SiH}_m \quad \text{(Formula 1)}$$

wherein each A is independently an alkoxy (O—R) and each R is an independently selected organic moiety that can be an alkyl and/or aryl, and wherein n is an integer ranging from 1 to 3; m is an integer ranging from 1 to 3, and the sum of m and n is 4.

Preferably, R is an alkyl and more preferably, R is a straight chain alkyl. In one embodiment, each R is the same, although this is not a required feature.

In another embodiment of the invention, monofunctional precursors useful in the inventive processes include methoxysilane ($CH_3O$)$SiH_3$ and ethoxysilane ($CH_3CH_2O$)$SiH_3$). In another embodiment of the invention, difunctional silane precursors useful in the process of the invention include dimethoxysilane $(CH_3O)_2SiH_2$ and diethoxysilane $(CH_3CH_2O)_2SiH_2$.

In yet another embodiment of the invention, useful trifunctional alkoxysilanes include those wherein at least 2 of the R groups are independently $C_1$ to $C_4$ alkyl groups and the balance, if any, are independently selected from the group consisting of alkyl, phenyl, halogen, substituted phenyl and combinations thereof For purposes of this invention, a useful alkoxy moiety is defined to include an organic group which can be readily hydrolyzed from silicon at temperatures near room temperature. Suitable alkoxy groups include ethylene glycoxy or propylene glycoxy or the like, but preferably all alkoxy groups are independently selected from one or more of methoxy, ethoxy, propoxy and/or butoxy.

Simply by way of example, preferred trifunctional silane precursors useful in the processes of the invention include trimethoxysilane $((CH_3O)_3SiH)$, triethoxysilane $((CH_3CH_2O)_3SiH)$, or any of a wide range of art known trifunctional precursors.

In order to achieve satisfactory nanoporous silica strength, these trifunctional precursors will typically be blended/reacted with tetrafunctional silane precursors having a general formula of $$A_4\text{-}Si \qquad \text{(Formula 2)}$$

wherein each A is alkoxy (O—R) and R is defined as described above for the trifunctional precursors. Preferably, the tetrafunctional alkylsilane precursors include, for example, TEOS and/or TMOS and any other suitable art-known tetrafunctional alkylsilane precursors.

As previously mentioned above, in a further embodiment of the invention, the alkoxysilane compounds may be replaced, in whole or in part, by compounds with acetoxy and/or halogen-based leaving groups. For example, the precursor compound(s) may be acetoxy ($CH_3$—CO—O—), such as, e.g., an acetoxy-silane compound, and/or a halogenated compound, e.g., a halogenated silane compound, and/or combinations thereof For the halogenated precursors the halogen is, e.g., Cl, Br, I, and in certain aspects, will optionally include F. Exemplary acetoxy precursor compounds include, simply by way of example, tetraacetoxysilane. Exemplary halogen-based precursor compounds include, for example, dichlorosilane ($H_2Cl_2Si$), trichlorosilane ($HCl_3Si$), tetrachlorosilane ($Cl_4Si$) and combinations thereof.

A 5–100% mol substitution of a trifunctional precursor (e.g., trimethoxysilane) for a tetrafunctional precursor (e.g., tetraethoxysilane) for a given targeted solids content can be used. Preferably, the molar ratio of mono-, di- and/or trifunctional precursor to tetrafunctional precursor ranges from about 20% to 75% and, in certain optional embodiments, is 50%.

In an alternative embodiment, hydrogen silsesqueoxanes ($HSiO_{1.5}$) are reacted with such tetrafunctional precursors. This later process also provides a film having the required mechanical strength, because the hydrolyzed SiH bonds of the silsesqueoxanes can cross-link with the tetrafunctional precursors.

As noted above in the Description of the Prior Art, the film, as applied to the substrate, is typically catalyzed with an acid or base catalyst and additional water to cause polymerization/gelation ("aging") and to yield sufficient strength so that the film does not shrink significantly during drying. Preferably, in the processes of the invention, the film is aged by treatment with a volatile acid vapor such as, for example, hydrochloric, hydrofluoric and/or nitric acid, to name but a few art known volatile acids. The acid vapor is employed at a vapor pressure range ranging from about 1 to 760 torr. More preferred is a vapor pressure ranging from about 10 to about 760 torr, and most preferably is a vapor pressure range from about 100 to about 760 torr (mm Hg). Generally, hydrochloric acid vapor is preferred.

(2) Optionally treating wet films produced by method (1), or nanoporous films produced by any other suitable method, by reacting the silanols (SiOH) or alkoxy groups (SiOR) of the nanoscale pore surfaces with reactive silane species. These reactive silane species contain both reactive groups and a SiH. Example reactive species include trichlorosilane, dichlorosilane, dimethoxysilane, diethoxysilane, ethoxysilane, trimethoxysilane and triethoxysilane, to name but a few. This process step can be conducted during or after deposition of the film onto a suitable substrate and provides an additional measure of hydrophobicity and/or a further reduced dielectric constant for the resulting nanoporous silica film.

(3) Optionally treating dried films produced by method (1) or any other suitable method of film production by reacting the silanols (SiOH) or alkoxy groups (SiOR) of the pore surfaces with reactive silane species. Such post-drying treatment is conducted using suitable reactive surface modification agents that include silanol (SiOH) and/or alkoxy (SiOR) functional groups, and, as for (2) above, provides an additional measure of hydrophobicity and/or a further reduced dielectric constant.

Thus, for the embodiments of the invention, as described above, that employ optional supplementary surface modification reagents, it will be appreciated that suitable surface modification agent or agents may be selected, as described, for example, by co-owned U.S. patent application Ser. No. 09/235,186, filed on Jan. 22, 1999, and Ser. No. 09/111,084, filed on Jul. 7, 1998, the disclosures of which are incorporated herein in their entireties. Such surface modification agents are selected from a wide range of compounds within the above description that are effective when employed in vapor phase (see "A" below) and/or liquid phase (see "B" below) surface modification processes.

A. VAPOR PHASE SURFACE MODIFICATION AGENTS

Vapor phase surface modification agents are those which exhibit satisfactory boiling point/vapor pressure, reactivity, purity, and which yield an effective and heat stable hydrophobic surface on the treated film without causing significant undesirable effects. Desirable vapor phase surface modification agents will have vapor pressures suitable for conducting a vapor phase reaction according to the invention. For example, the vapor pressure of a suitable surface modification agent, at the temperature at which the reaction is conducted, will range from about 1 to about 1000 torr. Preferably, the vapor pressure of a suitable surface modification agent will range from about 5 to about 750 torr. Most preferably, the vapor pressure of a surface modification agent will range from about 10 to about 500 torr. Of course, the artisan will appreciate that the temperature ranges employed in the processes of the invention will affect the desired vapor pressure ranges and that the temperature ranges will vary widely depending upon whether the film to be processed is wet or dry during the surface modification.

Suitable vapor phase surface modification agents include, but are not limited to, dichlorosilane ($H_2Cl_2Si$), trichlorosilane ($HCl_3Si$), trimethoxysilane [$H(OMe)_3Si$], and triethoxysilane [$H(OEt)_3Si$], chlorosilane ($H_3ClSi$), methoxysilane ($H_3(CH_3O)Si$ and/or combinations thereof.

In further embodiments of the invention, depending upon the final desired film thickness and refractive index, the vapor-phase surface modification reaction may be conducted before or after drying of the film on a substrate. It will also be appreciated that the vapor-phase reaction may be conducted by any suitable method and employing any appropriate apparatus. For example, in one embodiment, a flowing carrier gas stream is employed to carry the modification agent, in vapor form, into contact with a film-bearing substrate to be treated at a temperature favorable to the silylation reaction. The reaction is preferably enclosed in a suitable flow chamber or apparatus. One such apparatus is illustrated, simply by way of example, by FIG. 1.

Figure 1:
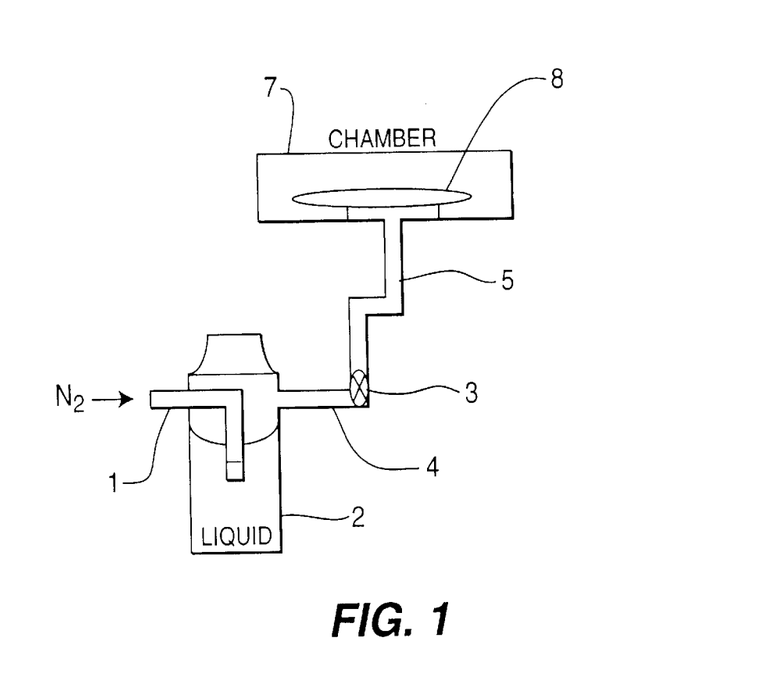
FIG. 1 is a schematic representation of an $N_2$ gas/vapor phase flow apparatus.

Referring to FIG. 1, a carrier gas, e.g., an inert gas such as $N_2$ gas, passes through inlet (1) to enter a vaporization chamber (2) containing a vaporizable surface modification agent or mixtures thereof, e.g., methoxysilane. The gas/vapor mixture is produced in the vaporization chamber by any art-known means, including, e.g., by heating, blowing the carrier gas over the liquid phase, evaporation from a wicking material, atomization, and the like. The resulting gas/vapor mixture is moved by pump (3), or optionally flows under positive pressure from the carrier gas source, through outlet conduit (4) to enter reaction chamber inlet conduit (5) and passes into a substantially closed reaction chamber (7) in which a film-bearing substrate is suitably supported, e.g., on platform (8). Optionally, the flowing vapor/gas mixture is thereafter vented to a recovery facility (not illustrated) wherein the surface modification agent is condensed for recycling and/or disposal. Alternatively, the vapor/gas circulation circuit may be fully or partially closed, so that the vapor/gas will be repeatedly circulated through the reaction chamber during the reaction process.

Of course, the artisan will appreciate that any suitable art known carrier gas that is compatible with the reaction processes may be employed, including, simply by way of example, the noble gases such as helium, argon, or other relatively inert gases such as the previously mentioned nitrogen. The inventive processes are also optionally conducted in an environment that includes one or more hydrogen-containing reducing fluids, e.g., liquids or gases.

In another embodiment of the invention, a film-bearing substrate is treated in a static chamber wherein the atmosphere has been previously evacuated and the surface modification agent subsequently introduced into the chamber for a period of time and under conditions favorable to effective silylation to render the film surface sufficiently hydrophobic. Alternatively, a filmbearing substrate is placed on a stand in a closed or covered chamber having a sufficient quantity of liquid surface modification agent at the bottom. When the surface modification agent evaporates it will diffuse into the film surface and render it hydrophobic.

The surface modification reaction is conducted generally by contacting a film to be treated with a suitable surface modification agent in vapor form, followed by heating for a relatively brief period or periods at an elevated temperature. Film is treated before, during or after the aging process but preferably, the nanoporous film is aged prior to treatment with a suitable surface modification agent. Thus, the film is contacted with the surface modification agent at a suitable temperature and for a duration sufficient to render the treated film effectively hydrophobic. Generally, the film is contacted with the reagent and the reaction is run at or about room temperature (e.g., 20–30° C.), for a time period sufficient to allow the agent to diffuse into the nanoscale pores and to undergo the modification reaction at the internal surface of the pores. Thus, the reaction time period is selected for the optimal process results, but generally ranges from about 0.5 minutes to about 6 hours, during which time the film remains in contact with the surface modification agent. Preferably, the film remains in contact with the agent for about 1 minute.

Thereafter, the treated film is dried by heating in air or and inert gas, e.g., nitrogen, for one or more time periods, ranging from about 5 seconds to about 10 minutes each, but preferably for about 1 minute for each heat treatment. The heating steps serve to drive remaining vapor phase material, e.g., surface modification agent, from the reaction step out of the pores. The number of heat treatments generally ranges from about 1 to about 5, but preferably two heat treatments are conducted, with the second heat treatment at a higher temperature than the first to ensure removal of the agent, while minimizing thermal stress on the film. The heat treatment is generally conducted at temperatures ranging from about 100 through about 400° C., or greater, and more preferably from about 150 to about 350° C. In particular, the first heat treatment is preferably conducted at a temperature ranging from about 150 to 200° C., and the second heat treatment is preferably conducted at a temperature ranging from about 250 to about 350° C.

B. LIQUID PHASE SURFACE MODIFICATION AGENTS

Of course, the above-described surface modification agent or agents are also employed, where convenient, in liquid form or solution. The nanoporous silica film can be formed on a suitable substrate immediately prior to treatment with a surface modification agent, or agents, or optionally, the film is preformed on a suitable substrate and stored until needed. A nanoporous silica film to be treated can be contacted with a liquid state surface modification agent by any art known method, including, e.g., by immersion and/or spray deposition. In a preferred embodiment, a silane based surface modification agent is spun onto a prepared nanoporous silica film while it is still wet. In an alternative embodiment, the nanoporous silica film is dried before treatment.

Preferred surface modification agents suitable for liquid phase treatment of a nanoporous film of the invention include, e.g., silylation agents such as dichlorosilane ($H_2Cl_2Si$), trichlorosilane ($HCl_3Si$), trimethoxysilane [$H(OMe)_3Si$], and triethoxysilane [$H(OEt)_3Si$] and/or combinations thereof Solvent exchange is conducted with any suitable low surface tension co-solvent. While not wishing to be bound by any theory or hypothesis as to the operation of the process, it is believed that a low surface tension solvent exchange co-solvent more readily permits penetration of the nano-scale pore structure of the nanopore silica film, while avoiding collapsing that pore structure. For solvent exchange, the amount of silylation agent, in an optional co-solvent, ranges from about 1 to about 50 percent by volume. Such a co-solvent is selected from any inert solvent, i.e., a solvent that will not directly react with the silylation agent but that is miscible therewith. In one preferred embodiment, acetone is employed as the solvent exchange co-solvent.

Liquid phase treated films are then dried by any suitable method, e.g., spun dry at a suitable rotational speed for a brief period of time, ranging, for example, from about 100 to about 5000 rpm for a time period ranging from about 1 to 20 seconds, but preferably at about 1000 rpm for about 5 seconds.

The applied film is then baked and thereafter cured to form the nanoscale pore structures within the film. Generally, curing may be done by any means known in the art. Preferably, the curing is conducted by first drying the film by heating or baking in air for one or more time periods, ranging from about 5 seconds to about 10 minutes each, but preferably for about 1 minute for each heat treatment. The heating can optionally be conducted in one step, but is more preferably conducted in a series of steps, with sequentially increasing temperature, in order to drive out remaining solvent and then to provide the final curing step fully polymerized.

The number of heat treatments generally ranges from about 1 to about 5, but preferably two heat treatments are conducted, the second heat treatment at a higher temperature than the first to ensure removal of remaining solvents, while minimizing thermal stress on the film. The heat treatment is generally conducted at temperatures ranging from about 100 through about 400° C., or greater. In particular, the first heat treatment is preferably conducted at a temperature ranging from about 150 to 200° C., and the second heat treatment is preferably conducted at a temperature ranging from about 250 to about 350° C., and completes the curing process.

C. HIGH AND LOW ORGANIC SILOXANE DIELECTRIC LAYER(S) FOR PLANARIZATION

Optionally, the nanoporous dielectric film prepared from multifunctional precursors, as described above, is applied to the substrate and cured, and then at least one additional layer, e.g., a second dielectric composition film, including a dielectric film suitable for leveling the surface of the intended integrated circuit, is applied to the cured first dielectric composition film, and then cured. In another embodiment of the invention the first layer, a nanoporous silica dielectric film is applied to the substrate and then the second dielectric composition film is applied to the first dielectric composition film and then both films are cured together.

Simply by way of example, a polymer precursor suitable for forming the upper level or second layer dielectric material is dispersed in a suitable compatible solvent and applied onto the lower level dielectric. Suitable solvent compositions include those which have a boiling point of about 120° C. or less, preferably about 100° C. or less. Suitable high volatility solvent compositions nonexclusively include methanol, ethanol, n-propanol, isopropanol, n-butanol, propyl acetate and mixtures thereof Other relatively high volatility solvent compositions which are compatible with the other ingredients can be readily determined by those skilled in the art. The solvent is preferably present in an amount of from about 10% to about 90% by weight of the overall blend, more preferably from about 15% to about 80% and most preferably from about 40% to about 60% by weight of the overall blend with the polymer.

The upper dielectric material may be applied to the coated substrates via the conventional coating methods mentioned above. The thickness of the dielectric film on the substrate may vary depending on the amount of liquid dielectric that is applied to the substrate, but typically the thickness may range from about 500 (to about 50,000, and preferably from about 1000 to about 12000). The amount of dielectric liquid applied to the substrate may vary from about 1 ml to about 10 ml, and preferably from about 2 ml to about 8 ml. In the preferred embodiment, the liquid material is spun onto the surface the lower level dielectric according to similar techniques as those mentioned above.

The added dielectric layer or layers preferably comprise a polymer having a structure I or II. Polymers having the structure I are of low organic content, e.g., where the carbon containing substituents are present in an amount of less than about 40 mole percent. These polymers are described more fully in U.S. patent application Ser. No. 09/044,831, filed Mar. 20, 1998, which is incorporated herein by reference. Formula 3–9 are as follows and include siloxane polymers having the structure:

(Formula 3)

(Formula 4)

(Formula 5)

(Formula 6)

wherein the sum of n and m, or the sum or x, y and z is from about 8 to about 5000, and m and y are selected such that carbon containing substituents are present in an amount of less than about 40 mole percent. R, is selected from substituted and unsubstituted straight chain and branched alkyl groups, cycloalkyl groups, substituted and unsubstituted aryl groups, and mixtures thereof The specific mole percent of carbon containing substituents is a function of the ratio of the amounts of starting materials. In a preferred embodiments the mole percent of carbon containing substituents is in the range of from about 15 mole percent to about 25 mole percent.

In another embodiment of the invention, the added dielectric layer or layers may comprise polymers having structure II, which are of high organic content, e.g., wherein the carbon containing substituents are present in an amount of about 40 mole percent or more. These polymers are described more fully in U.S. patent application Ser. NO. 09/044,798, filed Mar. 20, 1998, which is incorporated herein by reference. Such have the formulae 6–10:

(Formula 7)

(Formula 8)

(Formula 9)

wherein the sum of n and m is from about 8 to about 5000 and m is selected such that the carbon containing substituent is present in an amount of from about 40 Mole percent or greater; and (Formula 10)

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof The specific mole percent of carbon containing substituents is a function of the ratio of the amounts of starting materials.

Polymer precursors in accordance with Formulas 3–10 have a polymer backbone encompassing alternate silicon and oxygen atoms. In contrast with previously known organosiloxane resins, polymers I and II have essentially no hydroxyl or alkoxy groups bonded to backbone silicon atoms. Rather, each silicon atom, in addition to the aforementioned backbone oxygen atoms, is bonded only to hydrogen atoms and/or R groups as defined in the formulae. By attaching only hydrogen and/or R groups directly to backbone silicon atoms in the polymer, unwanted chain lengthening and crosslinking is avoided i.e., stock solutions are more stable. Each silicon atom of the polymer is bonded to at least three oxygen atoms. Moieties bonded to the polymer backbone include hydrogen and organic moieties.

Polymer precursors according to Formulas 3–10 may be prepared by a dual phase solvent system using a catalyst. For example, starting materials may be trichlorosilane and an organotrichlorosilane, for either an alkyl or an aryl substituted trichlorosilane. The relative ratios of the trichlorosilane and the organotrichlorosilane determine the mole percent carbon-containing substituents in the polymer.

Polymer precursors of the structures 3–10 may be prepared by mixing a solution of at least one organotrihalosilane and hydridotrihalosilane to form a mixture; combining the mixture with a dual phase solvent which includes both a non-polar solvent and a polar solvent; adding a catalyst to the dual phase solvent and trihalosilane mixture, thus providing a dual phase reaction mixture; reacting the dual phase reaction mixture to produce an organohydridosiloxane; and recovering the organohydridosiloxane from the non-polar portion of the dual phase solvent system. Additional information on preparation of these polymers is provided by co-owned U.S. application Ser. No. 09/328,548, filed on Jun. 9, 1999, the disclosure of which is incorporated by reference herein in its entirety.

D. OXYGEN PLASMA-RESISTANT HYDRIDOSILOXANES

In another optional embodiment, the dielectric films of the invention are coated with one or more additional dielectric layers formed from polymer precursors of Formula 11, that are useful to provide added mechanical strength and improved surface hydrophobicity. Previously, these polymer precursors have also been appreciated for providing oxygen plasma resistant dielectric films and coatings to facilitate further processing of the desired integrated circuit device.

$(HSiO_{1.5})_a(HSiO(OR))_b(SiO_2)_c$,  (Formula 11)

wherein R is a mixture of H and an alkyl group having from 1 to 4 carbon atoms; a+b+c=1; 0.5<a<0.99; 0.01<b<0.5; and 0<c<0.5.

Preferably, a and b are zero, and Formula II provides for an oxygen plasma resistant hydridosilsesquioxane.

In brief, such polymers may be prepared from, for example, trialkoxysilane or tetraalkoxysilane or mixtures thereof, as starting materials, using either plastic reaction vessels or glass vessels pre-treated to reduce trace metal contamination. Such pretreatments are known in the art. In some embodiments, triethoxysilane (HTEOS) is the starting material. A reaction vessel is charged with HTEOS and an aprotic solvent, for example, acetone, to provide a reaction mixture. Other aprotic solvents such as ethyl acetate, n-propyl acetate, or tetrahydrofuran are alternatively employed. An acid/water mixture, e.g., nitric acid and water, is added dropwise to the reaction mixture while stirring. Other acids, such as acetic, formic, or phosphoric acid are alternatively used. Optionally, the reaction mixture is maintained at a temperature below 20° C. during the acid/water mixture addition. Once addition of the acid/water mixture is complete, the resulting solution is heated to reflux for approximately 6 and 9 hours to produce a solution of poly (hydrido siloxane) copolymer in accordance with Formula 11.

Alternatively, the synthesis is conducted at room temperature. A plastic vessel is charged with HTEOS, water, acid, and an aprotic solvent and the reaction mixture is stirred at room temperature (21° C.) for approximately 3 days to 14 days to provide a solution of poly (hydrido siloxane) copolymer in accordance with Formula 11. Further details for the preparation and characterization of polymers according to Formula 11 are found in co-owned U.S. Ser. No. 09/039,289, filed on Mar. 12, 1998, the disclosure of which is incorporated by reference herein in its entirety.

E. FILM SURFACE HYDROPHOBICITY

1. Hydrophobicity And Dielectric Constant

For the sake of simplicity and convenience, most of the Examples provided below measure the success of the surface treatment of the nanoporous silica films of the invention by qualitatively measuring the hydrophobicity of the produced film. Without being bound by any theory or hypothesis, this is considered to provide a useful and relative comparison of the films produced by various methods, because the degree to which the produced film is hydrophobic is believed to be an effective measure of the proportion of silanol moieties that are silylated on the pore surfaces of the film. This in turn provides a marker for successful production of the desired films of low dielectric constant. For example, as shown in the Examples below, a contact angle ranging from about 45 to about 90 degrees indicates that such a film has been sufficiently treated so that it has the desired hydrophobic properties.

It should be appreciated, however, that the determinations of the hydrophobic properties of the produced films are of greatest significance when comparing different reaction processes employing surface modification agents that are themselves of the same degree of hydrophobicity.

2. Determining Hydrophobic Properties of Produced Films

For the convenience of the reader, the following discussion of "contact angle" is provided so that the advantages of the inventive processes may be fully appreciated. In order to confirm the successful treatment of the pore surfaces of nanoporous films, a method of estimating the hydrophobicity of each film surface is desirable. One such method, simply by way of example, is to measure the "contact angle" of a water drop placed on a surface to be tested. The contact angle provides a qualitative measure of relative hydrophobicity by showing how well or poorly a drop of water wets or spreads the surface of the film, Compared to a water droplet on a hydrophobic surface, a drop of water on a substrate surface with poor hydrophobic properties forms a low and wide dome over such a surface. The contact angle measurements thus provides an estimate of the degree of curvature of a water drop on a test surface and serves to provide a qualitative measure of the surface hydrophobicity.

Figure 2:
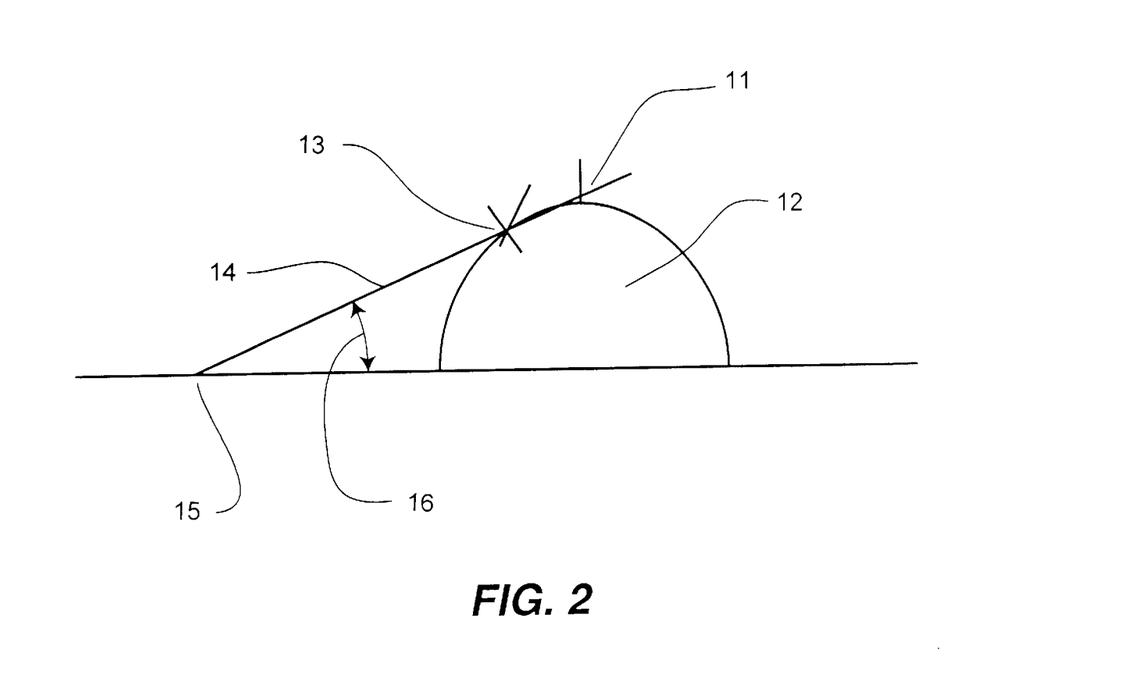
FIG. 2 is a diagram illustrating the measurement of a "contact angle" in the determination of relative hydrophobicity of produced nanoporous films.

With reference to FIG. 2, a typical "contact angle" measurement is conducted by placing a water droplet on a film to be tested. The film to be tested is on a substrate that is mounted so that the tested film is fully horizontal and parallel to the Earth's surface. A vertical marking surface, e.g., a cardboard, plastic or paper surface, is placed so that the droplet is between the vertical surface and the observer. The contact angle of each water drop is then measured by observing the water drop from the side and by then marking the vertical surface behind the center top (11) of the water drop (12). A second mark is then placed on the left or right side of the highest curvature point on the drop (13). A straight line (14) is then drawn through the marks to the surface of the film (15) and the angle (16) can then be measured to provide approximated values.

The following non-limiting examples serve to further explain and illustrate the invention.

EXAMPLE 1

This example demonstrates that a silane monomer can be used in combination with TEOS to yield films that contain hydrogen groups on the pore surface. The basic concept is that the hydrogen groups will have a higher affinity for solvent than silica, therefore, once a nanoporous silica film has been formed, the hydrogen groups will be on the pore surface. The presence of these hydrogen groups renders the nanoporous silica film hydrophobic.

A 50% mol substitution of trimethoxysilane for tetraethoxysilane is employed for this example.

1. The precursor is synthesized by adding 52.5 mL of tetraethoxysilane (Pacific Pac, Hollister, Calif. 95023), 33.4 mL of trimethoxysilane (Gelest, Tullytone, Pa. 19007), 47.0 mL of triethylene glycol monomethyl ether (Pacific Pac, Hollister, Calif. 95023), 8.4 mL of deionized water, and 0.34 mL of 1N nitric acid (J. T. Baker, Phillipsburg, N.J. 06885) together in a round bottom flask. The solution is allowed to mix vigorously, then heated to ~80° C. and refluxed for 1.5 hours to form a solution. After the solution is allowed to cool, it is diluted 25% by weight with ethanol (Ricca Chemical Company, Arlington, Tex. 76012) to reduce the viscosity. The diluted precursor is then filtered to 0.1 µm using a Teflon™ filter.
2. Approximately 8.0–10.0 ml of the precursor is deposited onto a 8" inch silicon wafer on a spin chuck, and is spun at 2500 rpm for 30 seconds.
3. The resulting film is then gelled and aged in a vacuum chamber using the following conditions: 1) The chamber is evacuated to a pressure of minus 20 inches of mercury. 2) Next, the film is aged by contact with HCl vapor admitted into the chamber at about 300 torr. The HCl treatment is conducted at room temperature, for a time period ranging from about 2 to about 5 minutes. 3) Finally, the chamber is evacuated to minus 20 inches of mercury and then back-filled with nitrogen.
4. The film is then solvent exchanged using 20–30 mL of acetone (Pacific Pac, Hollister, Calif. 95023), spun on the film at 250 rpm's for 20 seconds without allowing the film to dry. The films are then spun dry at 1000 rpm for 5 seconds
5. The produced film is then heated at elevated temperatures, in this instance for a duration of 1 min. each, at 175° C. and 320° C. in air.

The described process produces nanoporous silica films having the following characteristics:

a film thickness of about 9000 Angstroms;

a measured refractive index of approximately 1.14;

a hydrophobic film surface as indicated by a water droplet contact angle greater than 45 degrees; and a measured film dielectric constant of about 2.0 or less.

EXAMPLE 2

This example demonstrates that hydrophilic nanoglass films can be reacted with hydrogen containing silanes to render the surface hydrophobic. The basic concept of this example is that a regular nanoglass aged film (i.e. still containing pore fluid) can be silylated by using any of the below agents. The chlorine and the alkoxy (e.g., OR's) silylation agents in the presence of $H_2O$ might self-react and then react with the pore surface, or they might react directly with the pore surface 1. The precursor is synthesized by adding 104.0 mL of tetraethoxysilane (Pacific Pac, Hollister, Calif. 95023), 47.0 mL of triethylene glycol monomethyl ether (Pacific Pac, Hollister, Calif. 95023), 8.4 mL of deionized water, and 0.34 mL of 1N nitric acid (J. T. Baker, Phillipsburg, N.J. 06885) together in a round bottom flask. The solution is allowed to mix vigorously then heated to ~80° C. and refluxed for 1.5 hours to form a solution. After the solution is allowed to cool, it is diluted 25% by weight with ethanol (Ricca Chemical Company, Arlington, Tex 76012) to reduce the viscosity. The diluted precursor is then filtered to 0.1 µm using a Teflon™ filter.
2. Approximately 8.0–10.0 ml of the precursor is deposited onto an 8" inch silicon wafer on a spin chuck, and is spun at 2500 rpm for 30 seconds.
3. The produced film is then gelled and aged in a vacuum chamber as described above in Example 1.

The film produced by the above steps is then solvent exchanged using 20–30 mL of a 5/95 (by vol.) mixture of Trichlorosilane (Aldrich Chemical Company, Milwaukee, Wis. 53201) in Acetone (Pacific Pac, Hollister, Calif. 95023), that is spun on each film at 250 rpm's for 20 seconds, without allowing the film to dry. The produced films are then spun dry at 1000 rpm for 5 seconds.

1. The spun films are then heated at elevated temperatures, in this instance for a duration of 1 min. each, at 175° C. and 320° C. in air.

The described process produces a nanoporous silica film on the chosen substrate having the following characteristics a film thickness of about 9000 Angstroms;

a measured refractive index of approximately 1.14;

a hydrophobic film surface as indicated by a water droplet contact angle greater than 45 degrees or better; and a measured film dielectric constant of about 2.0 or less.

EXAMPLE 3

This example demonstrates that a hydrophilic nanoglass film can be reacted with hydrogen containing silanes to render the surface hydrophobic or more hydrophobic.

1. The precursor is synthesized by adding 104.0 mL of tetraethoxysilane (Pacific Pac, Hollister, Calif. 95023), 47.0 mL of triethylene glycol monomethyl ether (Pacific Pac, Hollister, Calif. 95023), 8.4 mL of deionized water, and 0.34 mL of 1N nitric acid (J. T. Baker, Phillipsburg, N.J. 06885) together in a round bottom flask. The solution is then allowed to mix vigorously, and is then heated to ~80° C. and refluxed for 1.5 hours to form a solution. After the solution is allowed to cool, it is diluted 25% by weight with ethanol (Ricca Chemical Company, Arlington, Tex. 76012) to reduce the viscosity. The diluted precursor is then filtered to 0.1 µm using a Teflon™ filter.
2. Approximately 8.0–10.0 ml of the precursor is deposited onto a 8" inch silicon wafer on a spin chuck, and is spun at 2500 rpm for 30 seconds.

The film is gelled and aged in a vacuum chamber as for Example 1, above.

3. The produced films are then heated at elevated temperatures, in this instance for a duration of 1 min. each, at 175° C. and 320° C. in air.
4. The films are then silylated for 20.0 min. statically by adding 5 ml of trichlorosilane (Aldrich Chemical Company, Milwaukee, Wis. 53201) to the bottom of a petri-dish. A film is placed on a stand in the petri-dish and the dish is covered. Trichlorosilane is evaporated from the dish and allowed to diffuse into the film to promote silylation of the pore surface.
5. The films are then heated again at elevated temperatures for 1 min. each at 175° C. and 320° C. in air.

The described process produces a nanoporous silica film on the chosen substrate having the following characteristics a film thickness of about 9000 Angstroms;

a measured refractive index of approximately 1.14;

a hydrophobic film surface as indicated by a water droplet contact angle greater than 45 degrees or better; and a measured film dielectric constant of about 2.0 or less.

EXAMPLE 4

This example demonstrates that a nanoporous silica film can be prepared and then solvent exchanged to provide a pore surface having both SiC and SiH bonds Methods 1. The precursor was synthesized by adding 104.0 mL of tetraethoxysilane (Pacific Pac, Hollister, Calif. 95023), 51.0 mL of Triethyl ene glycol mono methyl ether (TriEGMME)(Pacific Pac, Hollister, Calif. 95023), 8.4 mL of deionized water, and 0.34 mL of 1N nitric acid (J. T. Baker, Phillipsburg, N.J. 06885) together in a round bottom flask. The solution was allowed to mix vigorously then heated to ~80° C. and refluxed for 1.5 hours to form a solution. After the solution was allowed to cool to room temperature, it was stored in refrigeration at 4° C. The solution was then diluted 25% by weight with ethanol (Ricca Chemical Company, Arlington, Tex. 76012) to reduce the viscosity. The diluted precursor was filtered to 0.1 μm using a Teflon™ filter.

2. Approximately 8.0–10.0 ml of the precursor was deposited onto an 8 inch silicon wafer, and spun at 2500 rpm for 30 seconds.

3. The film was gelled and aged in a vacuum chamber using the following conditions: 1) The chamber was evacuated to −20 "Hg. 2) Next, 15M ammonium hydroxide (Aldrich Chemical Company, Milwaukee, Wis. 53201) was heated and equilibrated at 45 ° C. and dosed into the chamber to increase the pressure to −4.0 "Hg for 3 minutes. 3) Finally, the chamber was evacuated to −20.0 "Hg and backfilled with air.

4. The film was then solvent exchanged with a 5% (by wt.) mixture of methyltriacetoxysilane (MTAS) (Gelest Inc., Tullytown, Pa. 19007) in 3-pentanone (Aldrich Chemical Company, Milwaukee, Wis. 53201) was mixed together. Approximately 20–30 mls of this mixture was deposited on the film while spinning at 250 rpm's for 20 seconds without allowing the film to dry. The film was then spun dry at 1000 rpm for 5 seconds.

5. The film was heated at elevated temperatures for 1 min. each at 175° C. and 320° C. in air, the films were allowed to cool to ambient temperature, loaded into a quartz wafer holder and then inserted into a vertical tube furnace. The samples in the furnace were kept under $N_2$ gas with a flow rate of 67 liters/min. The temperature in the furnace was initially at about 150° C., and then ramped to 400° C. at a rate of 20° C. per min. Once the temperature reached 400° C., the films were held at that temperature for 0.5 hr. This yielded 5,000–6,000 Å films.

6. A low organic siloxane polymer produced by AlliedSignal Advanced Microelectronic Materials (Sunnyvale, Calif.) named LOSP™ that contains a silicon-oxygen backbone was deposited on top of the film at 3000 rpm for 20 sec. This polymer contains 3 oxygen atoms on every silicon atom while the remaining valence state has approximately 40 percent of an alkyl group and 60 percent hydrogen.

7. The new film was heated at 150° C., 200° C., and 350° C. for 1 min each, cooled to ambient temperature, and then loaded into a quartz wafer holder and inserted into a vertical tube furnace where they were kept under $N_2$ gas with a flow rate of 67 liters/min. As described above, the temperature in the furnace was initially at about 150° C., and was then ramped to 400° C. at a rate of 20° C. per min. The films were then held at 400° C. for 0.5 hr.

Results

The produced film was then characterized using Fourier transform infrared ("FTIR"), scanning electron microscopy ("SEM") cross-section, inspection of cracking/adhesion with light microscopy ("LM")

The FTIR spectra (not shown) demonstrated that after solvent exchange absorbance peaks were present in the produced film at C—H (2970 cm-1), Si—H (2250 cm-1), and Si—C (1270 cm-1), thus confirming that the film contained the desired proportion of C—H, Si—H and Si—C bonds. In addition, LM observations confirmed that the tested film appeared to be crack free when observed at lower magnifications. The SEM cross-sections showed no interlayer cracking, and good adhesion of the film to the substrate.

EXAMPLE 5

This example demonstrates that a nanoporous silica film can be prepared and then solvent exchanged so that at the pore surface consists primarily of SiH bonds.

1. The precursor was synthesized by adding 104.0 mL of tetraethoxysilane (Pacific Pac, Hollister, Calif. 95023), 51.0 mL of Triethylene glycol mono methyl ether (TriEGMME) (Pacific Pac, Hollister, Calif. 95023), 8.4 mL of deionized water, and 0.34 mL of IN nitric acid (J. T. Baker, Phillipsburg, N.J. 06885) together in a round bottom flask. The solution was allowed to mix vigorously then heated to ~80° C. and refluxed for 1.5 hours to form a solution. After the solution was allowed to cool to room temperature, it was stored in refrigeration at 4° C. The solution was then diluted 25% by weight with ethanol (Ricca Chemical Company, Arlington, Tex. 76012) to reduce the viscosity. The diluted precursor was filtered to 0.1 μm using a Teflon™ filter.

2. Approximately 8.0–10.0 ml of the precursor was deposited onto an 8 inch silicon wafer, and spun at 2500 rpm for 30 seconds.

3. The film was gelled and aged in a vacuum chamber using the following conditions: 1) The chamber was evacuated to −20 "Hg. 2) Next, 15M ammonium hydroxide (Aldrich Chemical Company, Milwaukee, Wis. 53201) was heated and equilibrated at 45° C. and dosed into the chamber to increase the pressure to −4.0 "Hg for 3 minutes. 3) Finally, the chamber was evacuated to −20.0 "Hg and backfilled with air.

4. The film was then solvent exchanged with a 5% (by wt.) mixture of Methyltriacetoxysilane (MTAS) (Gelest Inc., Tullytown, Pa. 19007) in 3-pentanone (Aldrich Chemical Company, Milwaukee, Wis. 53201) was mixed together. Approximately 20–30 mls of the mixture was deposited on the film while spinning at 250 rpm's for 20 seconds without allowing the film to dry. The film was then spun dry at 1000 rpm for 5 seconds.

1. The film was heated at elevated temperatures for 1 min. each at 175° C. and 320° C. in air, cooled to ambient temperature, and then loaded into a quartz wafer holder and inserted into a vertical tube furnace where they were kept under $N_2$ gas with a flow rate of 67 liters/min. As described above, the temperature in the furnace was initially at about 150° C., and was then ramped to 400° C. at a rate of 20° C. per min. The films were then held at 400° C. for 0.5 hr. This yielded 5,000 to 6000 Å thick films.

A polymer produced by AlliedSignal named OPX™ (an oxygen plasma resistant hydridosilsesquioxane) was deposited on top of the film at 3000 rpm for 20 sec. This polymer mostly contains 1 hydrogen for every silicon atom while the remaining valence states have oxygen atoms.

2. The new film was heated at 80° C., 150° C., and 200° C. for 1 min each, cooled to ambient temperature, and then loaded into a quartz wafer holder and inserted into a vertical tube furnace where they were kept under $N_2$ gas with a flow rate of 67 liters/min. As described above, the temperature in the furnace was initially at about 150° C., and was then ramped to 400° C. at a rate of 20° C. per min. The films were then held at 400° C. for 0.5 hr.

Results

The treated films were tested by FTIR, LM and SEM, as for Example 4, above.

As for the products of Example 4, the FTIR spectra showed a peak in the regions of: C—H (2970 cm-1), S—H (2250 cm-1), and Si—C (1270 cm-1). The film appeared to be crack free at lower LM magnifications. The SEM cross-sections showed no interlayer cracking, and good adhesion of the film to the substrate.

EXAMPLE 6

This example demonstrates that a nanoporous silica film can be prepared and then solvent exchanged so that the pore surface contains primarily SiC and SiH bonds 1. The precursor was synthesized by adding 104.0 mL of tetraethoxysilane (Pacific Pac, Hollister, Calif. 95023), 51.0 mL of Triethylene glycol mono methyl ether (TriEGMME) (Pacific Pac, Hollister, Calif. 95023), 8.4 mL of deionized water, and 0.34 mL of 1N nitric acid (J. T. Baker, Phillipsburg, N.J. 06885) together in a round bottom flask. The solution was allowed to mix vigorously then heated to −80° C. and refluxed for 1.5 hours to form a solution. After the solution was allowed to cool to room temperature, it was stored in refrigeration at 4° C. The solution was then diluted 25% by weight with ethanol (Ricca Chemical Company, Arlington, Tex. 76012) to reduce the viscosity. The diluted precursor was filtered to 0.1 μm using a Teflon™ filter.

2. Approximately 8.0–10.0 ml of the precursor was deposited onto an 8 inch silicon wafer, and spun at 2500 rpm for 30 seconds.

3. The film was gelled and aged in a vacuum chamber using the following conditions: 1) The chamber was evacuated to −20 "Hg. 2) Next, 15M ammonium hydroxide (Aldrich Chemical Company, Milwaukee, Wis. 53201) was heated and equilibrated at 45° C. and dosed into the chamber to increase the pressure to −4.0 "Hg for 3 minutes. 3) Finally, the chamber was evacuated to −20.0 "Hg and backfilled with air.

4. The film was then solvent exchanged with a 5% (by wt.) mixture of Methyltriacetoxysilane (MTAS) (Gelest Inc., Tullytown, Pa. 19007) in 3-pentanone (Aldrich Chemical Company, Milwaukee, Wis. 53201) was mixed together. Approximately 20–30 mls of the mixture was deposited on the film while spinning at 250 rpm's for 20 seconds without allowing the film to dry. The film was then spun dry at 1000 rpm for 5 seconds.

5. The film was heated at elevated temperatures for 1 min. each at 175° C. and 320° C. in air, cooled to ambient temperature, and then loaded into a quartz wafer holder and inserted into a vertical tube furnace where they were kept under $N_2$ gas with a flow rate of 67 liters/min. As described above, the temperature in the furnace was initially at about 150° C., and was then ramped to 400° C. at a rate of 20° C. per min. The films were then held at 400° C. for 0.5 hr. This yielded 5,000 to 6000 Å thick films.

6. A high organic siloxane polymer produced by AlliedSignal Advanced Microelectronic Materials (Sunnyvale, Calif.) named HOSP™ that contains a silicon oxygen backbone was deposited on top of the film at 3000 rpm for 20 sec. This polymer contains 3 oxygen atoms on every silicon atom while the remaining valence state has approximately 60 percent of an alkyl group and 40 percent hydrogen.

7. The new film was heated at 150° C., 200° C., and 350° C. for 1 min each. It was then cured at 400° C. ramped program for 0.5 hr with nitrogen.

8. The film was characterized using FTI, SEM cross-section, inspection of cracking/adhesion by LM, and water droplet penetration

What is claimed is:

1. A nanoporous dielectric film on a substrate prepared by a process comprising:

a) combining at least one mono-, di-, or tri-functional precursor with at least one tetrafunctional precursor in a reaction mixture to form a nanoporous film precursor:

b) recovering the nanoporous film precursor of (a) from said reaction mixture and depositing the same onto a suitable substrate, and c) gelling said deposited film to form a nanoporous dielectric coating on said substrate;

wherein said mono-, di-, or tri-functional precursor has a number of functional leaving groups ranging from 1 to 3; and wherein said mono, di-, or tri-functional precursor is an alkoxysilane having the formula:

$$A_n\text{-SiH}_m \qquad \text{(Formula 1)}$$

wherein each A is independently all alkoxy (O—R) and R is an organic moiety independently selected from the group consisting of an alkyl and an aryl, and wherein n is an integer ranging from 1 to 3; m is an integer ranging from 1 to 3 and the sum of m and n is 4; or wherein the mono-, di-, or tri-functional precursor is an acetoxy (CH3—CO—O—) such as an acetoxy-silane compound and/or a halogenated compound such as a halogenated silane compound and/or combinations thereof; and wherein the recovered nanoporous film precursor is deposited onto said substrate by a method selected from the group consisting of spin deposition, dip-coating, spray deposition and combinations thereof.

2. The nanoporous dielectric film of claim 1 that is prepared by a process wherein the mono-, di-, or tri-functional precursor is selected from the group consisting of mono-, di- and tri-functional alkoxysilanes, mono-, di- and tri-functional halosilanes and combinations thereof.

3. The nanoporous dielectric film of claim 1 that is prepared by a process wherein said tetrafunctional precursor is an alkoxysilane having the formula of $$A_4\text{-Si} \qquad \text{(Formula 2)}$$

wherein each A is independently an alkoxy (O—R) and R is an organic moiety independently selected from the group consisting of an alkyl and an aryl moeity.

4. The nanoporous dielectric film of claim 1 that is prepared by a process wherein said reaction mixture further comprises water and an organic solvent.

5. The nanoporous dielectric film of claim 1 that is prepared by a process wherein said tetrafunctional precursor is selected from the group consisting of tetramethoxysilane, tetraethoxysilane, tetraacetoxysilane, tetrachlorosilane and combinations thereof.

6. The nanoporous dielectric film of claim 1 that is prepared by a process wherein said mono-, di-, or tri-functional precursor is selected from the group consisting of methoxysilane, ethoxysilane, dimethoxysilane, diethoxysilane, trimethoxysilane, triethoxysilane, dichlorosilane, trichlorosilane, and combinations thereof.

7. The nanoporous dielectric film of claim 1 that is prepared by a process wherein said tetrafunctional precursor is replaced by a hydrogen silsesquioxane compound.

8. The nanoporous dielectric film of claim 1 that is prepared by a process wherein said reaction is conducted at a temperature ranging from about 0 to about 120° C.

9. The nanoporous dielectric film of claim 8 that is prepared by a process further comprising cooling the reaction mixture and diluting the reaction mixture with alcohol to facilitate recovery of the nanoporous film precursor.

10. The nanoporous dielectric film of claim 1 that is prepared by a process further comprising treating the film with a surface modification agent effective to render the film hydrophobic.

11. The nanoporous dielectric film of claim 10 that is prepared by a process wherein the surface modification agent is applied in a solution that comprises a ketone solvent.

12. The nanoporous dielectric film of claim 11 that is prepared by a process wherein the surface modification agent solution comprises a component selected from the group consisting of methyltriacetoxysilane, 3-pentanone and combinations thereof.

13. The nanoporous dielectric film of claim 10 that further comprises the additional steps of coating the formed nanoporous dielectric film with at least one additional layer comprising a silicon-based polymer precursor.

14. The nanoporous dielectric film of claim 1 that is prepared by a process that further comprises the additional steps of coating the formed nanoporous dielectric film with at least one additional layer comprising a silicon-based polymer precursor.

15. The nanoporous dielectric film of claim 14 that is prepared by a process where the silicon-based polymer precursor is selected from the group consisting of, an oxygen plasma resistant siloxane, a low organic content siloxane and a high organic content siloxane.

16. The nanoporous dielectric film of claim 1 that is prepared by a process further comprising heating the coated substrate of step (c) to remove residual reactants or solvents.

17. An integrated circuit comprising at least one nanoporous dielectric coating according to claim 1.

18. A process for forming a nanoporous dielectric film on a substrate which comprises the steps of:
(a) combining at least one mono- , di- or tri-functional precursor with at least one tetrafunctional precursor in a reaction mixture to form a nanoporous film precursor,
(b) recovering the nanoporous film precursor of (a) from said reaction mixture and depositing the same onto a suitable substrate, and
(c) gelling said deposited film to form a nanoporous dielectric coating on said substrate;
wherein said mono-, di-, or tri-functional precursor has a number of functional leaving groups ranging from 1 to 3.

19. The process of claim 18 wherein the mono-, di-, or tri-functional precursor is selected from the group consisting of mono-, di- and tri-functional alkoxysilanes, mono-, di- and tri-functional halosilanes and combinations thereof.

20. The process of claim 18 wherein the mono-, di-, or tri-functional precursor is an alkoxysilane having the formula $$A_n\text{-SiH}_m \quad \text{(Formula 1)}$$

wherein each A is independently an alkoxy (O—R) and R is an organic moiety independently selected from the group consisting of an alkyl and an aryl, and wherein n is an integer ranging from 1 to 3; m is an integer ranging from 1 to 3 and the sum of m and n is 4.

21. The process of claim 18 wherein said tetrafunctional precursor is an alkoxysilane having the formula of $$A_4\text{-Si} \quad \text{(Formula 2)}$$

wherein each A is independently an alkoxy (O—R) and R is an organic moiety independently selected from the group consisting of an alkyl and an aryl.

22. The process of claim 18 wherein said reaction mixture further comprises water and an organic solvent.

23. A nanoporous dielectric film on a substrate prepared by a process comprising:
(a) depositing a suitable spin-on-glass composition onto a substrate,
(b) gelling said deposited composition to form a nanoporous dielectric film on said substrate;
(c) treating the film with a surface modification agent effective to render the film hydrophobic
(d) coating the formed nanoporous dielectric film of step (c) with at least one additional layer comprising a silicon-based polymer precursor; and
(e) curing the coated nanoporous dielectric film;
wherein said spin-on-glass composition comprises at least one mono-, di-, or tri-functional precursor and at least one tetrafunctional precursor; wherein said mono-, di-, or tri-functional precursor has a number of functional leaving groups ranging from 1 to 3; and wherein said mono-, di-, or tri-functional precursor is an alkoxysilane having the formula:

$$A_n\text{-SiH}_m \quad \text{(Formula 1)}$$

wherein each A is independently an alkoxy (O—R) and R is an organic moiety independently selected from the group consisting of an alkyl and an aryl, and wherein n is an integer ranging from 1 to 3; m is an integer ranging from 1 to 3 and the sum of m and n is 4; or wherein the mono-, di-, or tri-functional precursor is an acetoxy (CH3—CO—O—) such as an acetoxy-silane compound and/or a halogenated compound such as a halogenated silane compound and/or combinations thereof; and wherein the recovered nanoporous film precursor is deposited onto said substrate by a method selected from the group consisting of spin deposition, dip-coating, spray deposition and combinations thereof.

24. The nanoporous dielectric film of claim 23 that exhibits Si—H bond absorbance at 2250 cm$^{-1}$ as measured by Fourier transform infrared spectroscopy.

* * * * *